(12) United States Patent
Shim et al.

(10) Patent No.: US 8,981,548 B2
(45) Date of Patent: Mar. 17, 2015

(54) INTEGRATED CIRCUIT PACKAGE SYSTEM WITH RELIEF

(75) Inventors: Il Kwon Shim, Singapore (SG); Jeffrey D. Punzalan, Singapore (SG); Henry Descalzo Bathan, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 839 days.

(21) Appl. No.: 12/123,995

(22) Filed: May 20, 2008

(65) Prior Publication Data

US 2008/0290485 A1    Nov. 27, 2008

Related U.S. Application Data

(60) Provisional application No. 60/940,245, filed on May 25, 2007.

(51) Int. Cl.
*H01L 23/48*   (2006.01)
*H01L 23/495*  (2006.01)
*H01L 21/56*   (2006.01)
*H01L 23/00*   (2006.01)

(52) U.S. Cl.
CPC ........ *H01L 23/49548* (2013.01); *H01L 21/568* (2013.01); *H01L 23/49503* (2013.01); *H01L 24/83* (2013.01); *H01L 24/48* (2013.01); *H01L 24/85* (2013.01); *H01L 2224/48247* (2013.01); *H01L 2924/01046* (2013.01); *H01L 2924/01079* (2013.01); *H01L 2924/14* (2013.01); *H01L 2924/15311* (2013.01); *H01L 2924/01029* (2013.01); *H01L 2224/85* (2013.01); *H01L 2224/83* (2013.01)
USPC ................... 257/690; 257/E23.031; 257/675; 257/667

(58) Field of Classification Search
USPC ................... 257/690, 675, 669, 667, E23.031
See application file for complete search history.

(56) References Cited

U.S. PATENT DOCUMENTS

| | | | | |
|---|---|---|---|---|
| 6,204,553 B1 * | 3/2001 | Liu et al. | | 257/676 |
| 6,650,020 B2 * | 11/2003 | Yamada et al. | | 257/783 |
| 6,777,788 B1 * | 8/2004 | Wan et al. | | 257/670 |
| 2003/0006055 A1 | 1/2003 | Chien-Hung et al. | | |

FOREIGN PATENT DOCUMENTS

| | | |
|---|---|---|
| JP | 05113380 | 5/1993 |
| JP | 09186550 | 7/1997 |
| JP | 2003068934 A | 3/2003 |
| JP | 2006310397 A | 11/2006 |
| TW | 200537667 | 11/2005 |
| TW | 200540955 | 12/2005 |
| TW | 200629451 | 8/2006 |
| TW | 200644220 | 12/2006 |

OTHER PUBLICATIONS

Office Action dated May 23, 2014 for TW Application No. 097118850.

* cited by examiner

*Primary Examiner* — Matthew Reames
(74) *Attorney, Agent, or Firm* — Ishimaru & Associates LLP

(57) ABSTRACT

An integrated circuit package system including: providing a die pad with a top, sides, and a bottom, the bottom having a relief with a flat surface and defining a wall and a center pad; mounting a barrier under the bottom of the die pad; mounting an integrated circuit die on the top of the die pad; encapsulating the integrated circuit die and the top and sides of the die pad with the wall preventing encapsulation from flowing along the barrier to reach the center pad; and mounting an external interconnect on the center pad.

20 Claims, 7 Drawing Sheets

INTEGRATED CIRCUIT PACKAGE SYSTEM WITH RELIEF

CROSS-REFERENCE TO RELATED APPLICATION(S)

This application claims the benefit of U.S. Provisional Patent Application Ser. No. 60/940,245 filed on May 25, 2007, and the subject matter thereof is hereby incorporated herein by reference thereto.

TECHNICAL FIELD

The present invention relates generally to integrated circuit package systems, and more particularly to integrated circuit systems with die attach paddles.

BACKGROUND ART

The rapidly growing market for portable electronics devices, e.g. cellular phones, laptop computers, and PDAs, are an integral facet of modern life. The multitude of portable devices represents one of the largest potential market opportunities for next generation packaging. These devices have unique attributes which have significant impacts on manufacturing integration, in that they must be generally small, light weight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging and materials engineering and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high speed computer devices which are projected to exceed one TeraHertz (THz) in the near future. The current technologies, materials, equipment, and structures offer challenges to the basic assembly of these new devices while still not adequately addressing cooling and reliability concerns.

The envelope of technical capability of next generation IC package assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus a need still remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: providing a die pad with a top, sides, and a bottom, the bottom having a relief with a flat surface and defining a wall and a center pad; mounting a barrier under the bottom of the die pad; mounting an integrated circuit die on the top of the die pad; encapsulating the integrated circuit die and the top and sides of the die pad with the wall preventing encapsulation from flowing along the barrier to reach the center pad; and mounting an external interconnect on the center pad.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
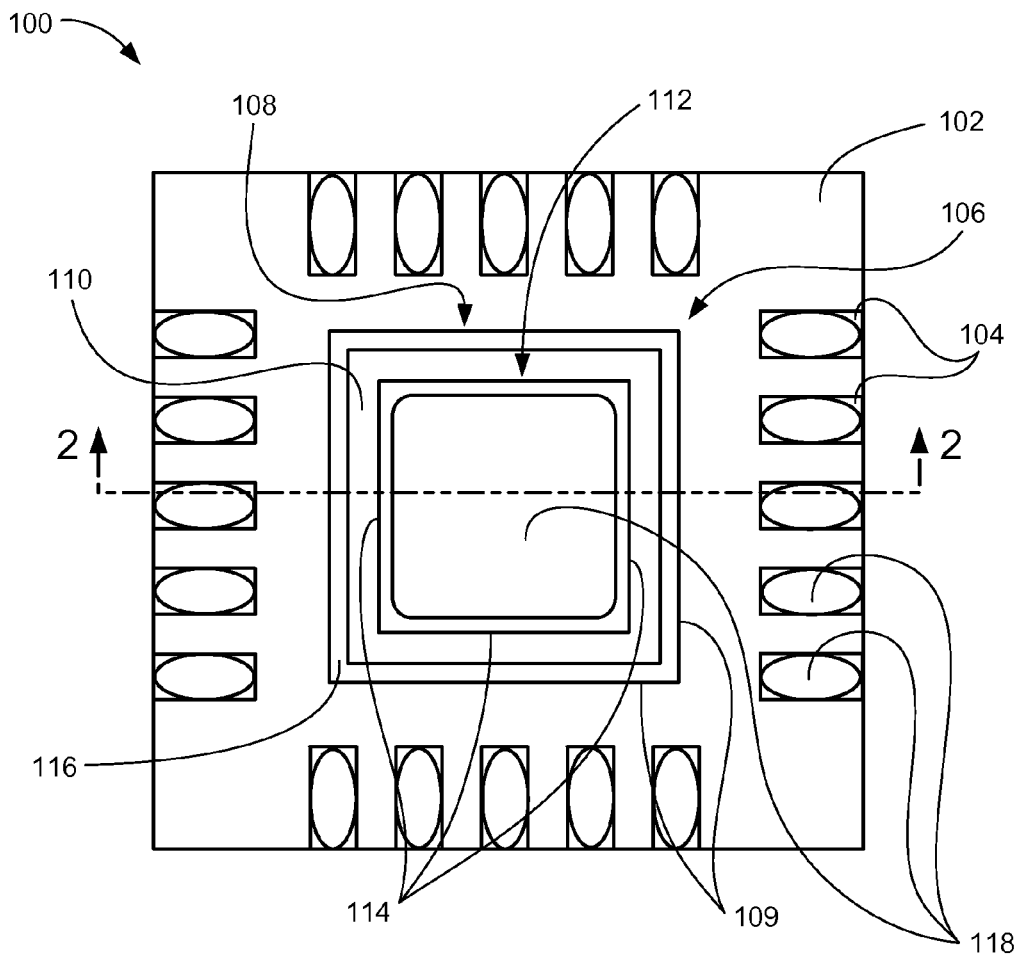
FIG. 1 is a bottom view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. Also, where multiple embodiments are disclosed and described having some features in common, for clarity and ease of illustration, description, and comprehension thereof, similar and like features one to another will ordinarily be described with like reference numerals.

Further, the embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the wire-bond die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure. The term "system" as used herein refers to and is defined as the method and as the apparatus of the present invention in accordance with the context in which the term is used.

A problem arises during the encapsulation phase of manufacture in which voids form in very small recesses under half-etched bond fingers and bond wires. These voids can lead to many problems as the lack of encapsulation may lead to inefficient heat conduction and less mechanical stability.

Also, because the recesses are very small it takes a relatively long time to mold the encapsulation into the recesses.

To solve these problems, inventors discovered that a barrier under the half-etched bond fingers and the bond wires could be used to increase the pressure.

This higher pressure decreased the time needed to fill the recesses and decreased the voids in the recesses. However, the increased pressure introduced new problems such as leakage.

Leakage occurs when the encapsulation, seeps past the barrier and contaminates the center pad. To correct this problem the inventors discovered that a wall around the center pad will stop the leakage at increased pressures and allow for increased production speed.

It should be noted that while prior art recesses under half-etched bond fingers and bond wires do not show the voids, complete encapsulation in these recesses are not an inherent feature. Those of ordinary skill in the art will recognize that prior art renderings without voids are merely due to artistic license.

Referring now to FIG. 1, therein is shown a bottom view of an integrated circuit package system 100 in a first embodiment of the present invention. The integrated circuit package system 100 is shown having an encapsulation 102, such as an epoxy mold compound (EMC).

The encapsulation 102 is shown encapsulating half-etched bond fingers 104 and a die pad 106 having a bottom 108 and die pad sides 109. The half-etched bond fingers 104 and the die pad 106 may be made from copper or a pre-plated finish material (PPF) such as gold, palladium, and nickel.

The bottom 108 of the die pad 106 has a relief 110 etched partially through the die pad 106. The relief 110 is a half-etched portion of the bottom 108 of the die pad 106. The relief 110 surrounds a center pad 112 in the bottom 108 of the die pad 106.

The center pad 112, such as a quadrilateral center pad, has center pad sides 114. The center pad 112 is oriented similar to the die pad 106. The relief 110 is surrounded by a wall 116.

The wall 116 in combination with the relief 110 prevents the encapsulation 102 from contaminating the center pad 112. Attached to the center pad 112 and the half-etched bond fingers 104 are external interconnects 118 such as solder bumps. The external interconnects 118 are not on the center pad sides 114 in the relief 110.

Figure 2:
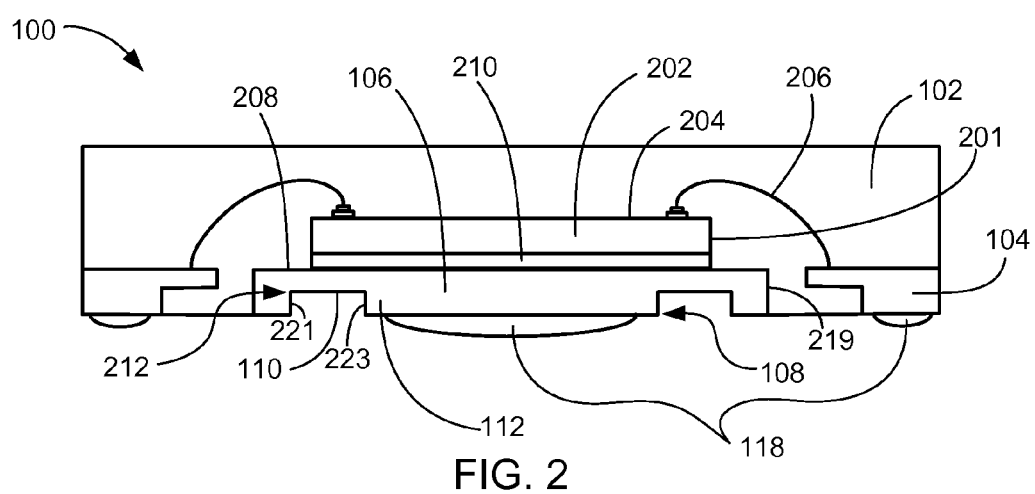
FIG. 2 is a cross sectional view of the integrated circuit package system along the line 2-2 of FIG. 1.

Referring now to FIG. 2, therein is shown a cross sectional view of the integrated circuit package system 100 along the line 2-2 of FIG. 1. The integrated circuit package system 100 is shown in greater detail having an integrated circuit die such as a wire-bonded die 202 with an active side 204 above the die pad 106.

The active side 204 of the wire-bonded die 202 is connected to the half-etched bond fingers 104 with bond wires 206. The wire-bonded die 202 is attached to a top surface 208 of the die pad 106 with a die attach adhesive 210. The relief 110 is shown having a flat surface 212.

The wall 116 of FIG. 1 prevents the encapsulation 102 from contaminating the center pad 112 at the bottom 108 of the die pad 106 as described above. The relief 110 physically defines an inner sidewall 221 of the wall 116 and a pad sidewall 223 of the center pad 112. The inner sidewall 221 directly faces the pad sidewall 223. The wall 116 includes an outer sidewall 219 on a side of the wall 116 facing opposite to the inner sidewall 221. The wall 116 prevents the encapsulation 102 from reaching the center pad 112. The center pad 112, the bottom 108, the inner sidewall 221 and the relief 110 are entirely exposed from the encapsulation 102. The encapsulation 102 is shown encapsulating the wire-bonded die 202 and the bond wires 206. A die sidewall 201 of the wire-bonded die 202 is between the inner sidewall 221 and the pad sidewall 223. Below the center pad 112 and the half-etched bond fingers 104, the external interconnects 118 are attached.

Figure 3:
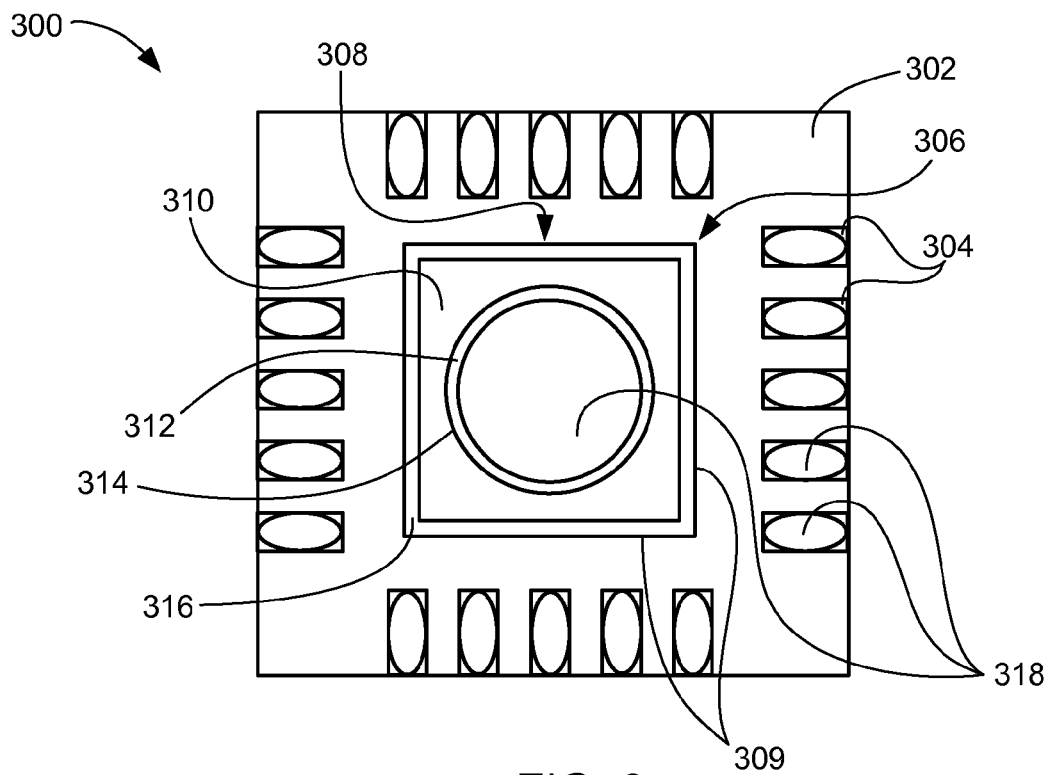
FIG. 3 is a bottom view of an integrated circuit package system in a second embodiment of the present invention.

Referring now to FIG. 3, therein is shown a bottom view of an integrated circuit package system 300 in a second embodiment of the present invention. The integrated circuit package system 300 is shown having an encapsulation 302, such as an EMC.

The encapsulation 302 is shown encapsulating half-etched bond fingers 304 and a die pad 306 having a bottom 308, and sides 309. The half-etched bond fingers 304 and the die pad 306 may be made from copper or a PPF such as gold, palladium, and nickel.

The bottom 308 of the die pad 306 has a relief 310 etched partially through the die pad 306. The relief 310 is a half-etched portion of the bottom 308 of the die pad 306. The relief 310 surrounds a center pad 312 in the bottom 308 of the die pad 306.

The center pad 312, such as a circular center pad, has one center pad side 314. The relief 310 is surrounded by a wall 316. The different configurations of the center pad 312 enable the integrated circuit package system 300 to be mounted to specialized connections on motherboards, substrates, or memory modules.

The wall 316 in combination with the relief 310 prevents the encapsulation 302 from contaminating the center pad 312. Attached to the center pad 312 and the half-etched bond fingers 304 are external interconnects 318 such as solder bumps. The external interconnects 318 are not on the center pad side 314 in the relief 310.

Figure 4:
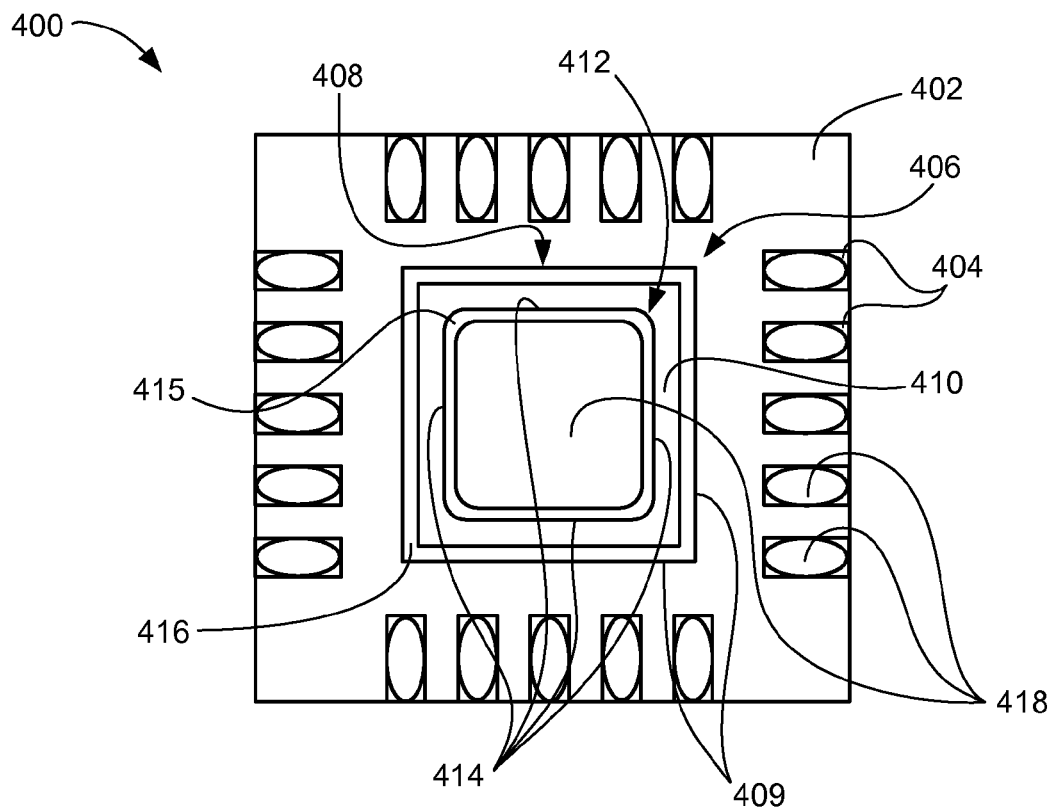
FIG. 4 is a bottom view of an integrated circuit package system in a third embodiment of the present invention.

Referring now to FIG. 4, therein is shown a bottom view of an integrated circuit package system 400 in a third embodiment of the present invention. The integrated circuit package system 400 is shown having an encapsulation 402, such as an EMC.

The encapsulation 402 is shown encapsulating half-etched bond fingers 404 and a die pad 406 having a bottom 408, and sides 409. The half-etched bond fingers 404 and the die pad 406 may be made from copper or a PPF such as gold, palladium, and nickel.

The bottom 408 of the die pad 406 has a relief 410 etched partially through the die pad 406. The relief 410 is a half-etched portion of the bottom 408 of the die pad 406. The relief 410 surrounds a center pad 412 in the bottom 408 of the die pad 406.

The center pad 412, such as a quadrilateral center pad, has center pad sides 414 and rounded corners 415. The center pad 412 is oriented similar to the die pad 406. The relief 410 is surrounded by a wall 416.

The different configurations of the center pad 412 enable the integrated circuit package system 400 to be mounted to specialized connections on motherboards, substrates, or memory modules.

The wall 416 in combination with the relief 410 prevents the encapsulation 402 from contaminating the center pad 412. Attached to the center pad 412 and the half-etched bond fingers 404 are external interconnects 418 such as solder bumps. The external interconnects 418 are not on the center pad sides 414 in the relief 410.

Figure 5:
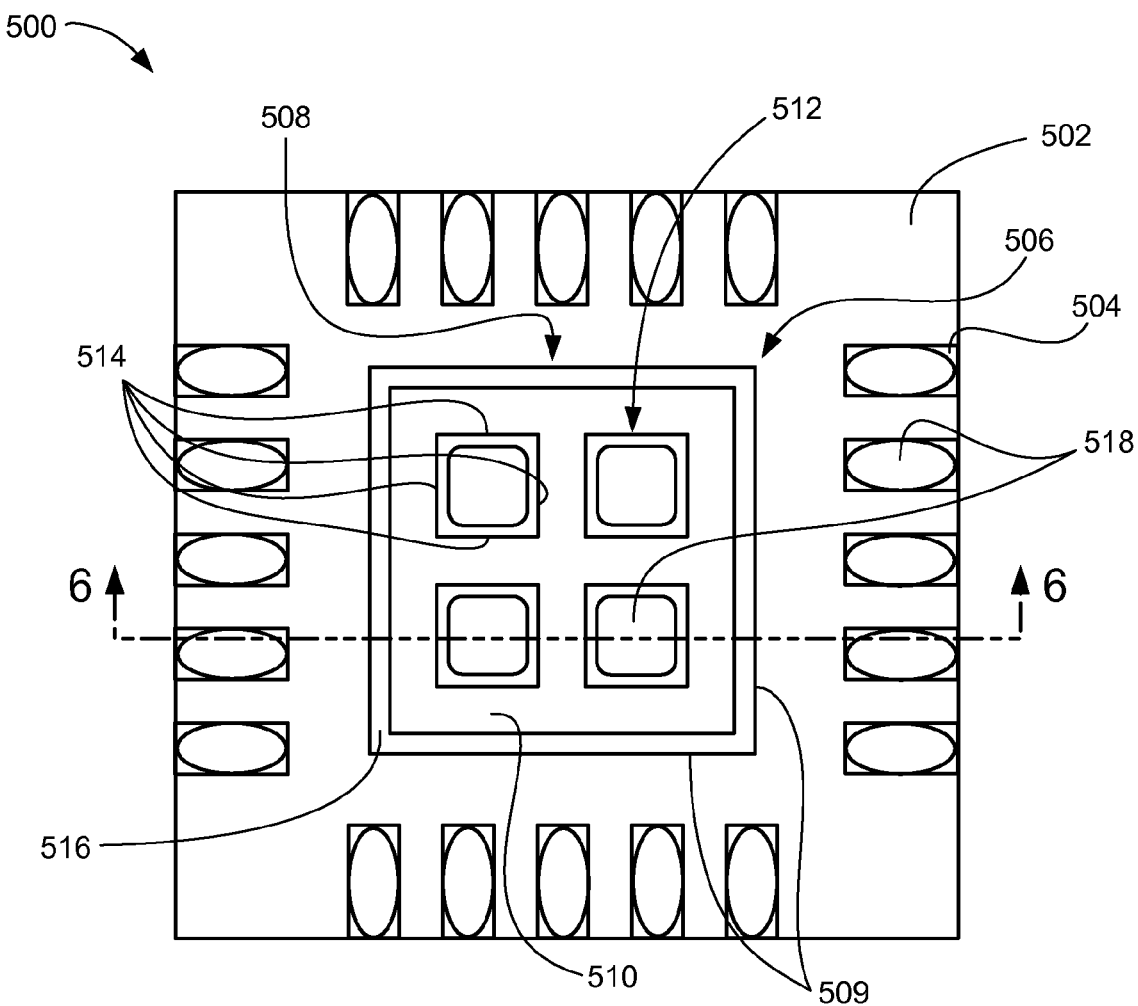
FIG. 5 is a bottom view of an integrated circuit package system in a fourth embodiment of the present invention.

Referring now to FIG. 5, therein is shown a bottom view of an integrated circuit package system 500 in a fourth embodiment of the present invention. The integrated circuit package system 500 is shown having an encapsulation 502, such as an EMC.

The encapsulation 502 is shown encapsulating half-etched bond fingers 504 and a die pad 506 having a bottom 508, and sides 509. The half-etched bond fingers 504 and the die pad 506 may be made from copper or a PPF such as gold, palladium, and nickel.

The bottom 508 of the die pad 506 has a relief 510 etched partially through the die pad 506. The relief 510 is a half-etched portion of the bottom 508 of the die pad 506. The relief 510 surrounds multiple center pads 512 in the bottom 508 of the die pad 506.

The multiple center pads 512, such as quadrilateral multiple center pads, have center pad sides 514. The multiple center pads 512 are oriented similar to the die pad 506. The relief 510 is surrounded by a wall 516.

The different configurations of the multiple center pads 512 enable the integrated circuit package system 500 to be mounted to specialized connections on motherboards, substrates, or memory modules.

The wall 516 in combination with the relief 510 prevents the encapsulation 502 from covering the multiple center pads 512. Attached to the multiple center pads 512 and the half-etched bond fingers 504 are external interconnects 518 such as solder bumps. The external interconnects 518 are not on the center Dad sides 514 in the relief 510.

Figure 6:
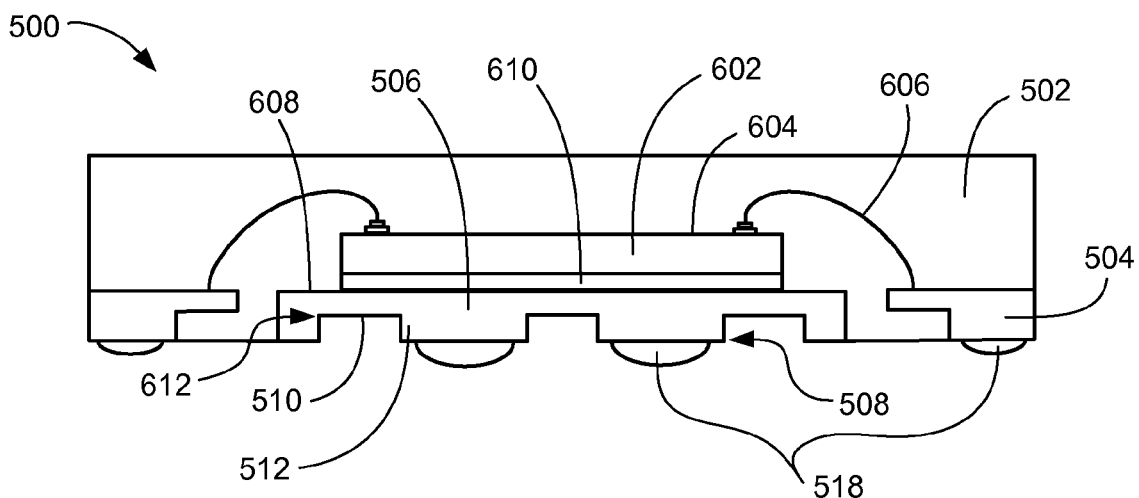
FIG. 6 is a cross sectional view of the integrated circuit package system along the line 6-6 of FIG. 5.

Referring now to FIG. 6, therein is shown a cross sectional view of the integrated circuit package system 500 along the line 6-6 of FIG. 5. The integrated circuit package system 500 is shown in greater detail having an integrated circuit die such as a wire-bonded die 602 with an active side 604 above the die pad 506.

The active side 604 of the wire-bonded die 602 is connected to the half-etched bond fingers 504 with bond wires 606. The wire-bonded die 602 is attached to a top surface 608 of the die pad 506 with a die attach adhesive 610. The relief 510 is shown having a flat surface 612.

The encapsulation 502 is shown encapsulating the wire-bonded die 602 and the bond wires 606. Below the multiple center pads 512 and the half-etched bond fingers 504, the external interconnects 518 are attached.

Figure 7:
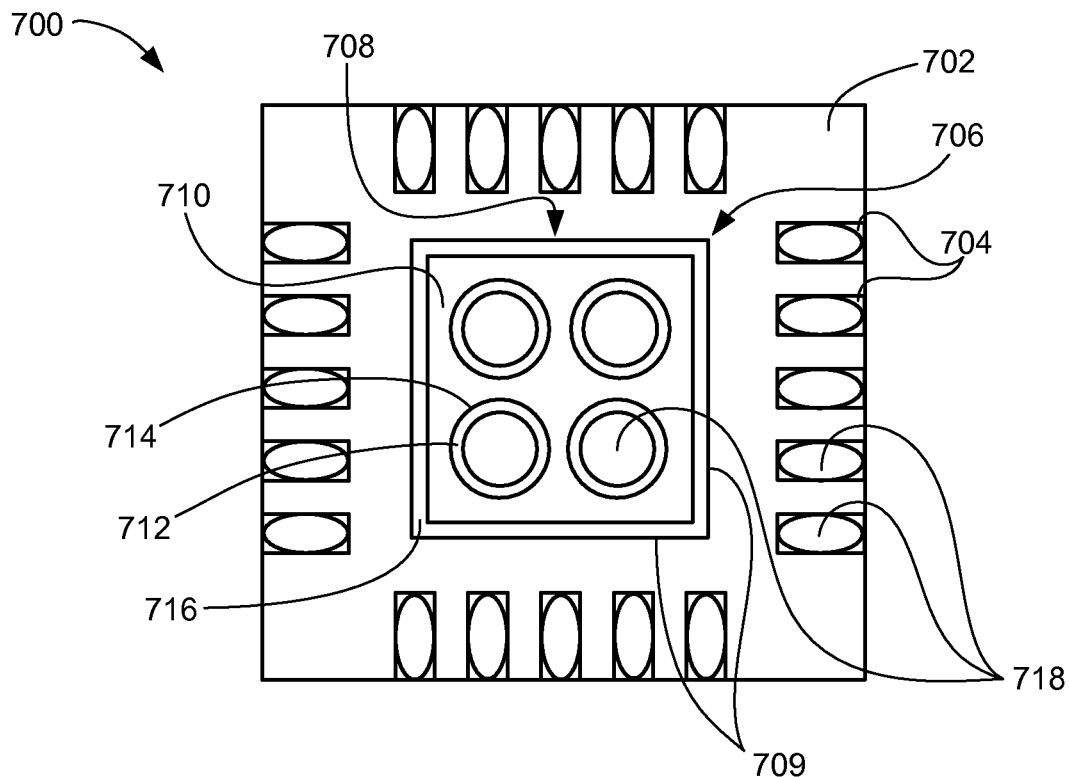
FIG. 7 is a bottom view of an integrated circuit package system in a fifth embodiment of the present invention.

Referring now to FIG. 7, therein is shown a bottom view of an integrated circuit package system 700 in a fifth embodiment of the present invention. The integrated circuit package system 700 is shown having an encapsulation 702, such as an EMC.

The encapsulation 702 is shown encapsulating half-etched bond fingers 704 and a die pad 706 having a bottom 708, and sides 709. The half-etched bond fingers 704 and the die pad 706 may be made from copper or a PPF such as gold, palladium, and nickel.

The bottom 708 of the die pad 706 has a relief 710 etched partially through the die pad 706. The relief 710 is a half-etched portion of the bottom 708 of the die pad 706. The relief 710 surrounds multiple center pads 712 in the bottom 708 of the die pad 706.

The multiple center pads 712, such as circular multiple center pads, have one center pad side 714. The relief 710 is surrounded by a wall 716.

The different configurations of the multiple center pads 712 enable the integrated circuit package system 700 to be mounted to specialized connections on motherboards, substrates, or memory modules.

The wall 716 in combination with the relief 710 prevents the encapsulation 702 from covering the multiple center pads 712. Attached to the multiple center pads 712 and the half-etched bond fingers 704 are external interconnects 718 such as solder bumps. The external interconnects 718 are not on the center pad side 714 in the relief 710.

Figure 8:
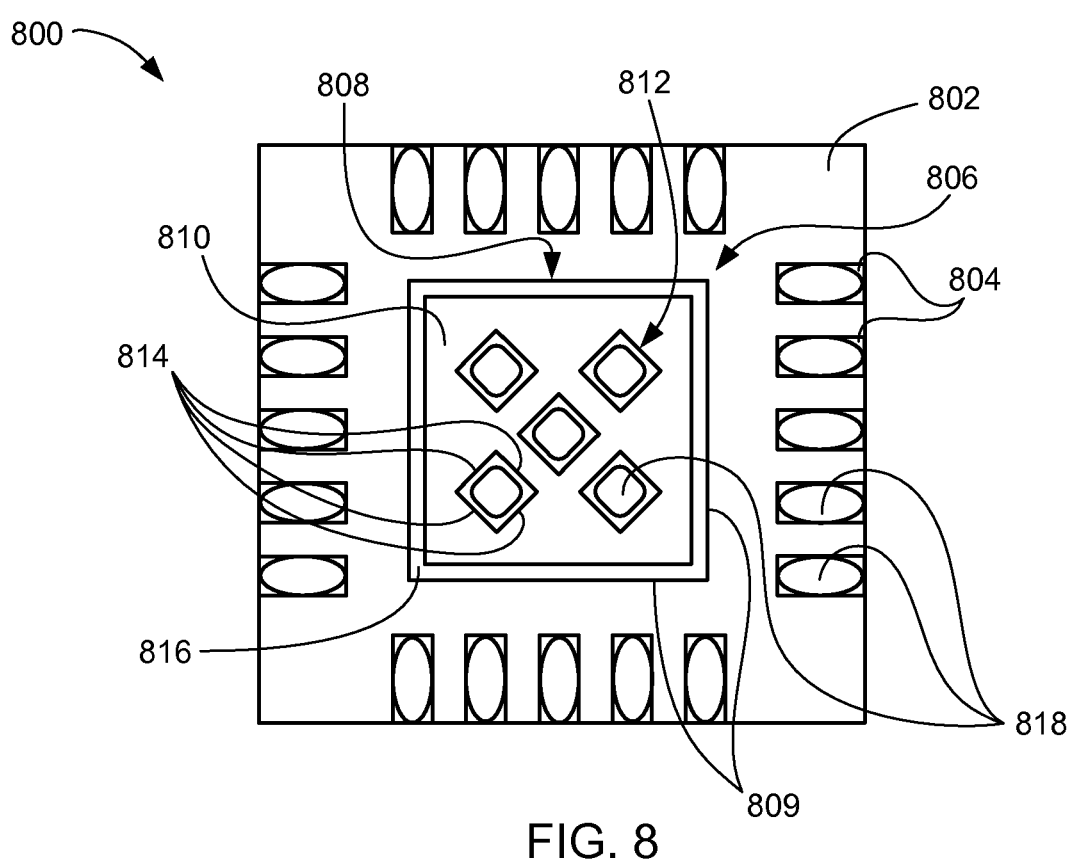
FIG. 8 is a bottom view of an integrated circuit package system in a sixth embodiment of the present invention.

Referring now to FIG. 8, therein is shown a bottom view of an integrated circuit package system 800 in a sixth embodiment of the present invention. The integrated circuit package system 800 is shown having an encapsulation 802, such as an EMC.

The encapsulation 802 is shown encapsulating half-etched bond fingers 804 and a die pad 806 having a bottom 808, and sides 809. The half-etched bond fingers 804 and the die pad 806 may be made from copper or a PPF such as gold, palladium, and nickel.

The bottom 808 of the die pad 806 has a relief 810 etched partially through the die pad 806. The relief 810 is a half-etched portion of the bottom 808 of the die pad 806. The relief 810 surrounds multiple center pads 812 in the bottom 808 of the die pad 806.

The multiple center pads 812, such as dissimilarly oriented center pads, have center pad sides 814. The center pad sides 814 form a perimeter of each of the multiple center pads 812 that is not parallel to a wall 816 formed at the sides 809 of the die pad 806. The multiple center pads 812 are oriented dissimilar to the die pad 806. The relief 810 is surrounded by the wall 816.

The different configurations of the multiple center pads 812 enable the integrated circuit package system 800 to be mounted to specialized connections on motherboards, substrates, or memory modules.

The wall 816 in combination with the relief 810 prevents the encapsulation 802 from covering the multiple center pads 812. Attached to the multiple center pads 812 and the half-etched bond fingers 804 are external interconnects 818 such as solder bumps. The external interconnects 818 are not on the center pad sides 814 in the relief 810.

Figure 9:
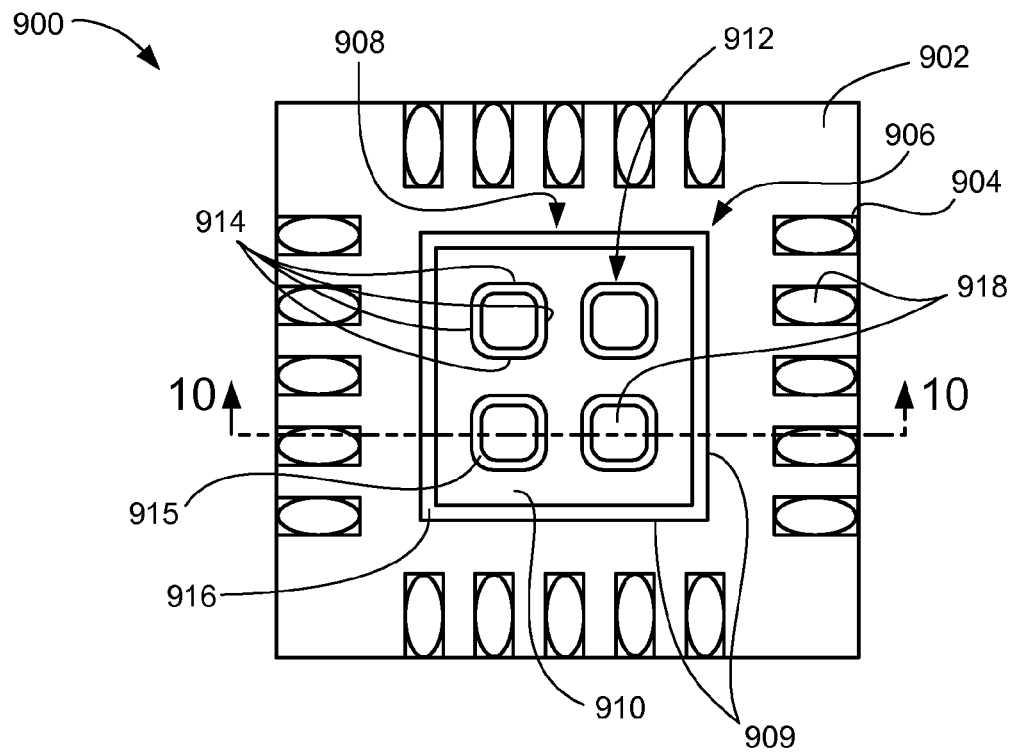
FIG. 9 is a bottom view of an integrated circuit package system in a seventh embodiment of the present invention.

Referring now to FIG. 9, therein is shown a bottom view of an integrated circuit package system 900 in a seventh embodiment of the present invention. The integrated circuit package system 900 is shown having an encapsulation 902, such as an EMC.

The encapsulation 902 is shown encapsulating half-etched bond fingers 904 and a die pad 906 having a bottom 908, and sides 909. The half-etched bond fingers 904 and the die pad 906 may be made from copper or a PPF such as gold, palladium, and nickel.

The bottom 908 of the die pad 906 has a relief 910 etched partially through the die pad 906. The relief 910 is a half-etched portion of the bottom 908 of the die pad 906. The relief 910 surrounds multiple center pads 912 in the bottom 908 of the die pad 906.

The multiple center pads 912, such as quadrilateral multiple center pads, have center pad sides 914 and round corners 915. The multiple center pads 912 are oriented similar to the die pad 906. The relief 910 is surrounded by a wall 916.

The wall 916 in combination with the relief 910 prevents the encapsulation 902 from covering the multiple center pads 912. Attached to the multiple center pads 912 and the half-etched bond fingers 904 are external interconnects 918 such as solder bumps. The external interconnects 918 are not on the center pad sides 914 in the relief 910.

Figure 10:
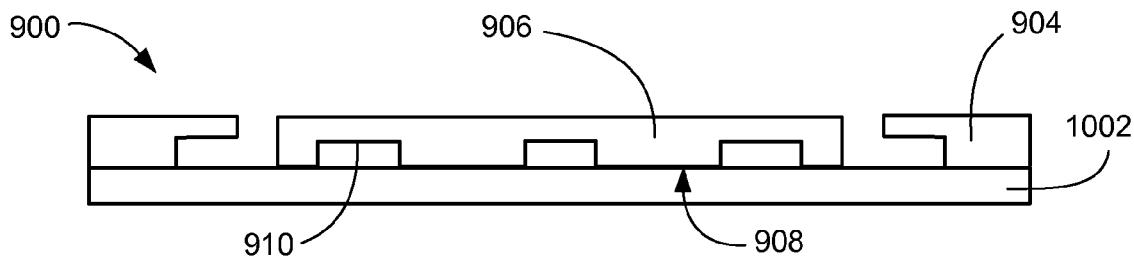
FIG. 10 is a cross sectional view of the integrated circuit package system along the line 10-10 of FIG. 9 in an intermediate barrier adhesion phase of manufacture.

Referring now to FIG. 10, therein is shown the integrated circuit package system 900 along the line 10-10 of FIG. 9 in an intermediate barrier adhesion phase of manufacture. The intermediate barrier adhesion phase of manufacture depicts the die pad 906 and the half-etched bond fingers 904 with a barrier 1002 mounted below. The barrier 1002 contacts the bottom 908 of the die pad 906, and isolates the relief 910.

Figure 11:
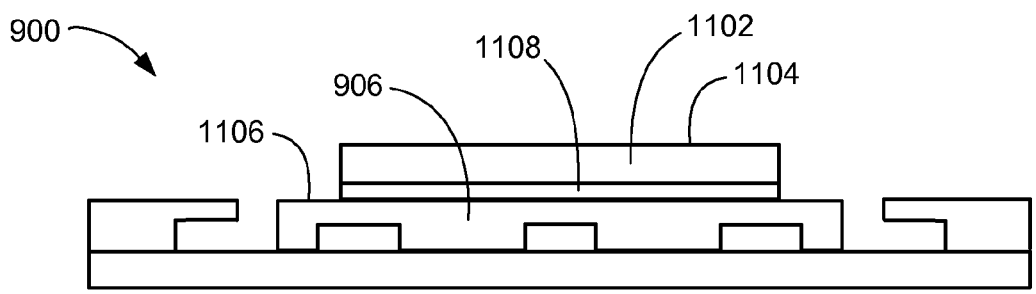
FIG. 11 is a cross sectional view of the integrated circuit package system of FIG. 10 in a die attach phase of manufacture.

Referring now to FIG. 11, therein is shown the integrated circuit package system 900 of FIG. 10 in a die attach phase of manufacture. The die attach phase of manufacture depicts an integrated circuit die such as a wire-bonded die 1102 with an active side 1104 above the die pad 906. The wire-bonded die 1102 is attached to a top surface 1106 of the die pad 906 is a die attach adhesive 1108.

Figure 12:
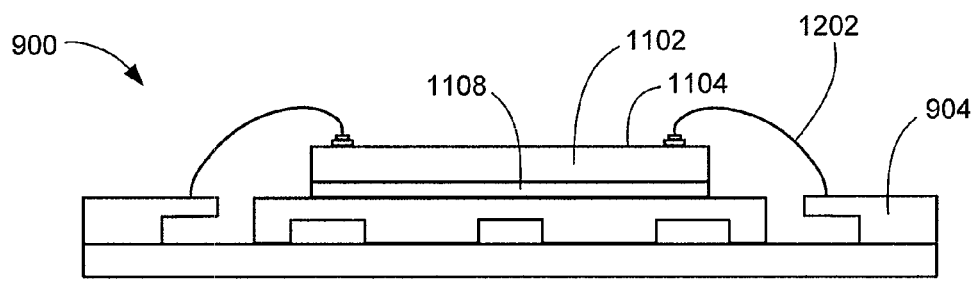
FIG. 12 is a cross sectional view of the integrated circuit package system of FIG. 10 in a wire bonding phase of manufacture.

Referring now to FIG. 12, therein is shown the integrated circuit package system 900 of FIG. 10 in a wire bonding phase of manufacture. The wire bonding phase of manufacture depicts the active side 1104 of the wire-bonded die 1102 connected to the half-etched bond fingers 904 with bond wires 1202.

Figure 13:
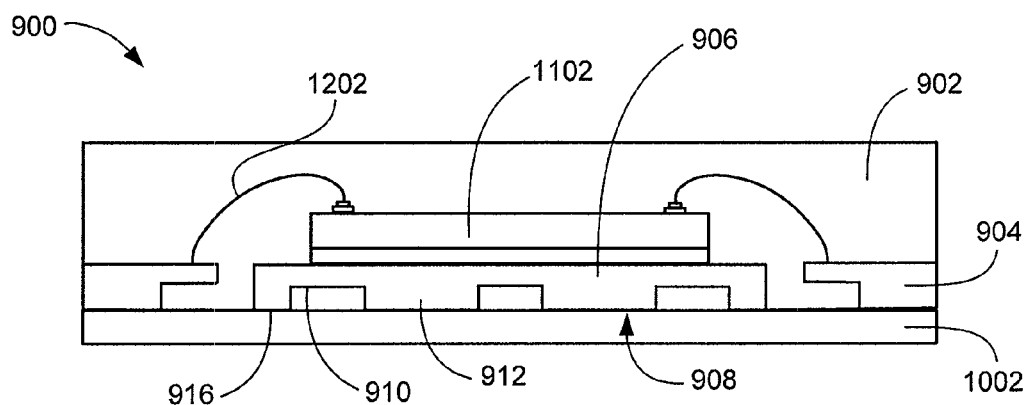
FIG. 13 is a cross sectional view of the integrated circuit package system of FIG. 10 in an encapsulation phase of manufacture.

Referring now to FIG. 13, therein is shown the integrated circuit package system 900 of FIG. 10 in an encapsulation phase of manufacture. The encapsulation phase of manufacture depicts the encapsulation 902 encapsulating the wire-bonded die 1102 and the bond wires 1202. The barrier 1002 is shown isolating the relief 910. This prevents the encapsulation from contaminating the multiple center pads 912 and the half-etched bond fingers 904 ensuring an unobstructed surface on which to continue processing.

It has been unexpectedly discovered that implementing the barrier 1002 allows increased process control and process speed. The barrier 1002 in combination with the wall 916, help protect against flash, or the encapsulation 902 from contaminating the multiple center pads 912. The barrier 1002 in combination with the wall 916 allows the encapsulation 902 to be molded quickly and with greater pressure without concern for the encapsulation 902 contaminating the multiple center pads 912.

Figure 14:
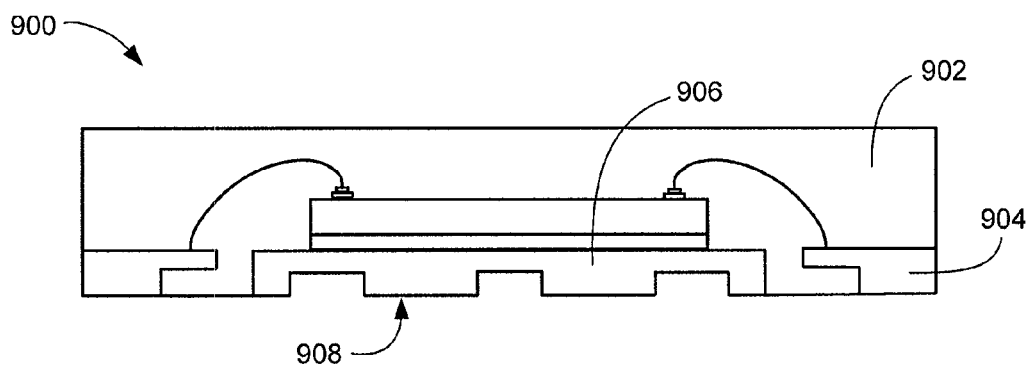
FIG. 14 is a cross sectional view of the integrated circuit package system of FIG. 10 in a barrier detach phase of manufacture.

Referring now to FIG. 14, therein is shown the integrated circuit package system 900 of FIG. 10 in a barrier detach phase of manufacture. The barrier detach phase of manufacture depicts the bottom 908 of the die pad 906 exposed. The encapsulation 902 does not contaminate the bottom 908 of the die pad 906 or below the half-etched bond fingers 904.

Figure 15:
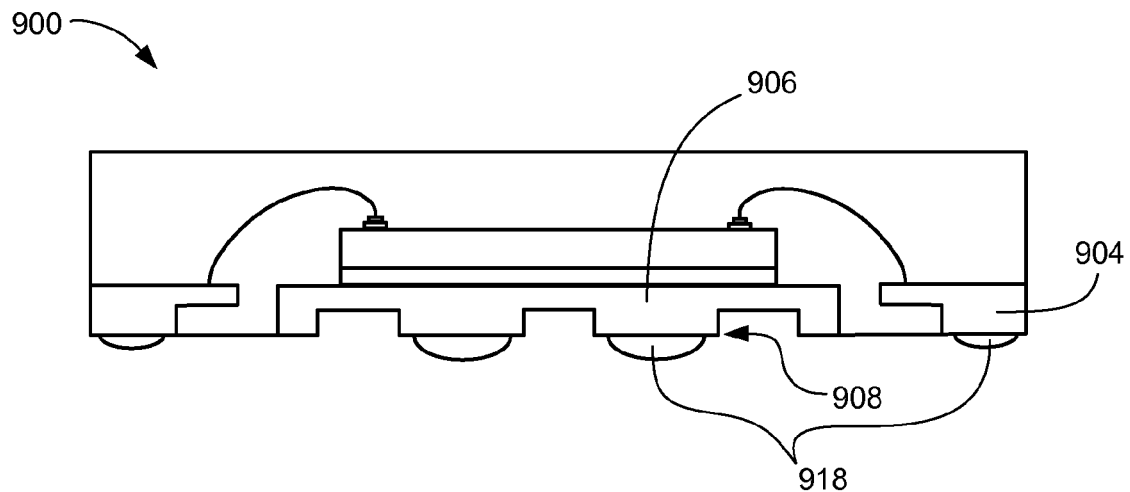
FIG. 15 is a cross sectional view of the integrated circuit package system of FIG. 10 in a solder bump phase of manufacture.

Referring now to FIG. 15, therein is shown the integrated circuit package system 900 of FIG. 10 in a solder bump phase of manufacture. The solder bump phase of manufacture depicts the external interconnects 918 connected to the bottom 908 of the die pad 906 and beneath the half-etched bond fingers 904.

Figure 16:
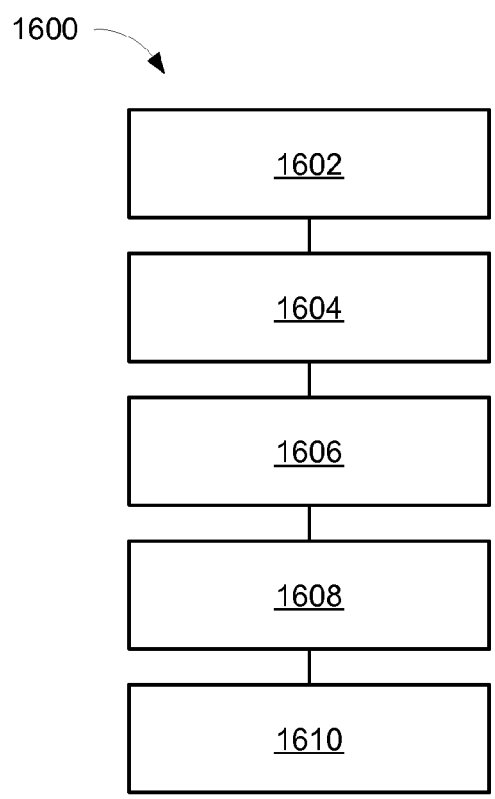
FIG. 16 is a flow chart of a system for manufacturing an integrated circuit package system with a relief exposed pad in an embodiment of the present invention.

Referring now to FIG. 16, therein is shown a flow chart of a system 1600 for manufacturing the integrated circuit package system 100. The system 1600 includes providing a die pad with a top, sides, and a bottom, the bottom having a relief with a flat surface and defining a wall and a center pad in a block 1602; mounting a barrier under the bottom of the die pad in a block 1604; mounting an integrated circuit die on the top of the die pad in a block 1606; encapsulating the integrated circuit die and the top and sides of the die pad with the wall preventing encapsulation from flowing along the barrier to reach the center pad in a block 1608; and mounting an external interconnect on the center pad in a block 1610.

Thus, it has been discovered that the relief system of the present invention furnishes important and heretofore unknown and unavailable solutions, capabilities, and functional aspects for increasing the speed and efficiency of production while simultaneously reducing the cost. The resulting processes and configurations are straightforward, cost-effective, uncomplicated, highly versatile and effective, can be surprisingly and unobviously implemented by adapting known technologies, and are thus readily suited for efficiently and economically manufacturing integrated circuit devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
   providing a die pad with a top and a bottom, the bottom having a wall, a center pad, and a relief having a flat surface, the relief physically defining an inner sidewall of the wall and a pad sidewall of the center pad with the inner sidewall directly facing the pad sidewall, the wall includes an outer sidewall on a side of the wall facing opposite to the inner sidewall;
   mounting a barrier under the bottom of the die pad;
   mounting an integrated circuit die on the top of the die pad, with a die sidewall of the integrated circuit die between the inner sidewall and the pad sidewall;
   encapsulating the integrated circuit die and the die pad with an encapsulation, the encapsulating entirely covering the outer sidewall and wherein the bottom, the inner sidewall, the flat surface of the relief and the center pad are entirely exposed from the encapsulation;
   detaching the barrier; and
   mounting an external interconnect on the center pad.

2. The method as claimed in claim 1 wherein:
   providing the die pad with the center pad includes providing a quadrilateral center pad.

3. The method as claimed in claim 1 wherein:
   providing the die pad with the center pad includes providing a circular center pad.

4. The method as claimed in claim 1 wherein:
   providing the die pad includes providing quadrilateral multiple center pads.

5. The method as claimed in claim 1 wherein:
   providing the die pad includes a pre-plated finish material of gold, palladium, and nickel.

6. A method for manufacturing an integrated circuit package system comprising:
   providing a die pad with a top and a bottom, the bottom having a wall, multiple center pads, and a relief with a flat surface, the relief physically defining an inner sidewall of the wall and a pad sidewall of a pad of the multiple center pads with the inner sidewall directly facing the pad sidewall, the wall includes an outer sidewall on a side of the wall facing opposite to the inner sidewall;
   mounting a barrier under the bottom of the die pad;
   mounting an integrated circuit die on the top of the die pad, with a die sidewall of the integrated circuit die between the inner sidewall and the pad sidewall;
   encapsulating the integrated circuit die and the die pad with an encapsulation, the encapsulation entirely covering the outer sidewall and wherein the bottom, the inner sidewall, the flat surface of the relief and the multiple center pads are entirely exposed from the encapsulation;
   detaching the barrier; and
   mounting a solder bump on each of the multiple center pads.

7. The method as claimed in claim 6 wherein:
   providing the die pad with the multiple center pads includes providing quadrilateral multiple center pads, circular multiple center pads, or quadrilateral multiple center pads.

8. The method as claimed in claim 6 wherein:
   mounting the integrated circuit die on the die pad includes mounting a wire-bonded die with an active side and attached with a die attach adhesive.

9. The method as claimed in claim 6 further comprising:
   providing half-etched bond fingers; and wherein:
   mounting the solder bump includes mounting the solder bump below the half-etched bond fingers; and
   connecting the integrated circuit die includes connecting the integrated circuit die with bond wires to the half-etched bond fingers.

10. The method as claimed in claim 6 wherein:
    mounting the solder bump includes the pad sidewall exposed from the solder bump.

11. An integrated circuit package system comprising:
    a die pad with a top and a bottom, the bottom having a wall, a center pad, and a relief having a flat surface, the relief physically defining an inner sidewall of the wall and a pad sidewall of the center pad with the inner sidewall directly facing the pad sidewall, the wall includes an outer sidewall on a side of the wall facing opposite to the inner sidewall;
    an integrated circuit die mounted on the top of the die pad, with a die sidewall of the integrated circuit die between the inner sidewall and the pad sidewall;
    an encapsulation formed on the integrated circuit die and the die pad, the encapsulation entirely covering the outer sidewall and wherein the bottom, the inner sidewall, the flat surface of the relief and the center pads are entirely exposed from the encapsulation; and
    an external interconnect mounted on the center pad.

12. The system as claimed in claim 11 wherein:
    the center pad is a quadrilateral center pad.

13. The system as claimed in claim 11 wherein:
    the center pad is a circular center pad.

14. The system as claimed in claim 11 wherein:
    the die pad includes quadrilateral multiple center pads.

15. The system as claimed in claim 11 wherein:
    the die pad includes a pre-plated finish material of gold, palladium, and nickel.

16. The system as claimed in claim 11 wherein:
    the die pad includes multiple center pads; and
    the external interconnect is a solder bump.

17. The system as claimed in claim 16 wherein:
    the multiple center pads are quadrilateral multiple center pads, circular multiple center pads, or quadrilateral multiple center pads.

18. The system as claimed in claim 16 wherein:
    the integrated circuit die mounted on the top of the die pad is a wire-bonded die with an active side and attached with a die attach adhesive.

19. The system as claimed in claim 16 further comprising:
    a bond finger;
    a bond wire between the integrated circuit die and the bond finger; and wherein:
    the solder bump is mounted below the bond finger.

20. The system as claimed in claim 16 wherein:
    the solder bump is mounted to each of the multiple center pads and the pad sidewall is exposed from the solder bump.

* * * * *

UNITED STATES PATENT AND TRADEMARK OFFICE
CERTIFICATE OF CORRECTION

PATENT NO. : 8,981,548 B2
APPLICATION NO. : 12/123995
DATED : March 17, 2015
INVENTOR(S) : Shim et al.

It is certified that error appears in the above-identified patent and that said Letters Patent is hereby corrected as shown below:

In the Specification:

1. Column 6, line 22, delete "Dad sides" and insert therefor --pad sides--

In the Claims:

2. Column 9, claim 1, line 20, delete "the encapsulating" and insert therefor --the encapsulation--

Signed and Sealed this
Fifth Day of April, 2016

Michelle K. Lee
*Director of the United States Patent and Trademark Office*